(12) United States Patent
Cai et al.

(10) Patent No.: US 10,672,497 B2
(45) Date of Patent: Jun. 2, 2020

(54) MEMORY SYSTEM AND METHOD FOR BAD BLOCK MANAGEMENT

(71) Applicant: SK Hynix Inc., Gyeonggi-do (KR)

(72) Inventors: Yu Cai, San Jose, CA (US); Fan Zhang, San Jose, CA (US); Naveen Kumar, San Jose, CA (US); Aman Bhatia, San Jose, CA (US); Chenrong Xiong, San Jose, CA (US); Xuanxuan Lu, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 16 days.

(21) Appl. No.: 16/022,451

(22) Filed: Jun. 28, 2018

(65) Prior Publication Data

US 2019/0304562 A1    Oct. 3, 2019

Related U.S. Application Data

(60) Provisional application No. 62/652,177, filed on Apr. 3, 2018.

(51) Int. Cl.
| | |
|---|---|
| *G11C 29/38* | (2006.01) |
| *G06F 11/10* | (2006.01) |
| *G06F 11/14* | (2006.01) |
| *G06F 3/06* | (2006.01) |

(52) U.S. Cl.
CPC .............. *G11C 29/38* (2013.01); *G06F 3/064* (2013.01); *G06F 3/0619* (2013.01); *G06F 3/0679* (2013.01); *G06F 11/1004* (2013.01); *G06F 11/1471* (2013.01); *G06F 2201/82* (2013.01)

(58) Field of Classification Search
CPC .... G06F 12/0238; G06F 3/0619; G06F 3/064; G06F 3/0679; G11C 29/04; G11C 29/38; G11C 8/06
See application file for complete search history.

(56) References Cited

U.S. PATENT DOCUMENTS

| | | | |
|---|---|---|---|
| 7,661,054 B2 | 2/2010 | Huffman | |
| 9,671,973 B2 | 6/2017 | Zhang | |
| 10,223,216 B1 * | 3/2019 | Dubeyko | ............ G06F 11/1658 |
| 2018/0307431 A1 * | 10/2018 | Gunnam | .................. G11C 8/06 |

* cited by examiner

*Primary Examiner* — Shelly A Chase
(74) *Attorney, Agent, or Firm* — Kilpatrick Townsend & Stockton LLP

(57) ABSTRACT

A method is provided for controlling a storage system, which can include a plurality of memory cells arranged in blocks and a memory controller coupled to the plurality of memory cells for controlling data write and read in the plurality of memory cells. The method includes identifying a block as a good block, if a count of bad pages in the block is zero, identifying the block as a degraded block if the count of bad pages is below a threshold number, and identifying the block as a bad block if the count of bad pages is above or equal to the threshold number. The method includes using good blocks and degraded blocks for read and program operations, and not using the bad blocks.

18 Claims, 11 Drawing Sheets

| Block No. | No. of Bad Pages | Location of Bad Pages |
|---|---|---|
| B1 | N1 | L1, L2, L3, . . . |
| B2 | N2 | |
| B3 | N3 | |
| ---------- | ---------- | ---------- |

FIG. 3B

MEMORY SYSTEM AND METHOD FOR BAD BLOCK MANAGEMENT

CROSS-REFERENCES TO RELATED APPLICATIONS

The present application claims priority to Provisional Application No. 62/652,177 entitled "BAD BLOCK MANAGEMENT," filed Apr. 3, 2018, which is assigned to the assignee hereof and expressly incorporated by reference herein in its entirety.

BACKGROUND OF THE INVENTION

The present invention relates generally to systems and methods for storage devices, and specifically to improving performance of non-volatile memory devices.

Solid-state memory is ubiquitously used in a variety of electronic systems including, for example, consumer electronic devices (e.g., cellular phones, cameras, computers, etc.) and in enterprise computing systems (e.g., hard drives, random access memory (RAM), etc.). Solid-state memory has gained popularity over mechanical or other memory storage techniques due to latency, throughput, shock resistance, packaging, and other considerations. Among these non-volatile memory devices, NAND flash memory devices are popular due to low manufacturing cost for a high degree of integration.

Flash-memory based solid state disk (SSD) drive can contain many flash memory dies. Each flash die can have thousands of physical blocks. Each block can include multiple flash pages. During the lifetime of SSD, the reliability quality of flash blocks may be degraded overtime, and some blocks may be identified as bad blocks and removed from the available flash block list. In some conventional systems, whenever a bad page or word line is found anywhere in a block, the block is marked as a bad block and removed from usage. As explained below, this practice can cause undesirable limitations of the memory device.

BRIEF SUMMARY OF THE INVENTION

In the conventional method of bad block management, a single bad page in a block can cause the whole block to be removed from usage. The inventors have recognized that this practice can reduce overprovision (OP) and lead to more write amplification (WA), which can degrade the reliability of the memory device, as explained further below. Some embodiments of the invention provide an intermediate state between a physical block changing from a good block to a bad block, when the number of bad word lines inside a block is less than a certain threshold. This technique can delay the block retirement, increase overprovisioning, and reduce unnecessary background operations. Some embodiments also includes techniques to cluster the block types and program the degraded block.

According to some embodiments, a system includes memory cells arranged in blocks, each block including multiple pages and each page having a number of memory cells. The system also includes a memory controller coupled to the memory cells for controlling erase, program, and read operations of the memory cells. The memory controller is configured to identify a block as a good block, if a count of bad pages in the block is zero, identify a block as a degraded block if the count of bad pages is below a threshold number, and identify a block as a bad block if the count of bad pages is above or equal to the threshold number. The memory controller is configured to use good blocks and degraded blocks for read and program operations, and not use the bad blocks.

In some embodiments, the system also includes a table of degraded blocks that, for each degraded block, lists a count of bad pages in the degraded block and locations of bad pages in the degraded block. The memory controller is configured to receive information regarding a bad page, and determine if the bad page is in a good block or degraded block. Upon determining that the bad page is in a good block, the good block is identified as a degraded block and creates an entry in the table of degraded blocks. Upon determining that the bad page is in a degraded block, the memory controller locates the degraded block in the table of degraded blocks, increases the count of bad pages in the degraded block, and records the location of the bad page. The memory controller also determines if the count of bad pages is greater than the threshold number. Upon determining that the count of bad pages is greater than the threshold number, the block is determined to be a bad block.

In some embodiments, receiving information regarding a bad page includes performing a read operation at a target page address and determining if a read failure has occurred. Upon detecting a read failure, the page is identified as a bad page. The system recovers correct data in the page at the target page address and copies the correct data to a good block.

In some embodiments, the memory controller is configured to receive a target page address for a program operation and determine if the target page address is in a good block, bad block, or a degraded block. Upon determining that the target page address is in a good block, the system performs the program operation at the target page address. Upon determining that the target page address is in a bad block, the system performs the program operation in a replacement block. Upon determining that the target page address is in a degraded block, the system determines if the target page address is directed to a bad page. Upon determining that the target page address is not directed to a bad page, the system performs the program operation at the target page address. Upon determining that the target page address is directed to a bad page, the system performs the program operation at a replacement page address.

In some embodiments, the system includes multiple super blocks. Each super block includes a plurality of blocks, and one of the plurality of blocks is configured as a parity block and other blocks are configured as data blocks. The parity block is configured to store parity information of the data blocks. The memory controller is configured to determine if a super block includes a degraded block, and, upon determining that the super block includes a degraded block, configure the degraded block as the parity block for the super block.

In some embodiments, the system includes multiple super pages. Each super page includes a plurality of pages, with one page from each block in the super block. One of the plurality of pages in a super page is configured as a parity page, and other pages are configured as data pages. The parity page is configured to store parity information of the data pages. The memory controller is configured to determine if a super page includes a bad page, and, upon determining that the super page includes a bad page, the memory controller excludes the bad page from operation and configures one of the remaining pages as a parity page and the other remaining pages as data pages.

In some embodiments, the system includes multiple super blocks, each super block including a plurality of blocks. The memory controller is configured to rank the plurality of blocks according to a reliability quality, and configure the block with the lowest reliability as a parity block and other blocks are configured as data blocks. The parity block is configured to store parity information of the data blocks.

According to some embodiments, a method is provided for controlling a storage system, which can include a plurality of memory cells arranged in blocks and a memory controller coupled to the plurality of memory cells for controlling data write and read in the plurality of memory cells. The method includes identifying a block as a good block, if a count of bad pages in the block is zero, identifying the block as a degraded block if the count of bad pages is below a threshold number, and identifying the block as a bad block if the count of bad pages is above or equal to the threshold number. The method includes using good blocks and degraded blocks for read and program operations, and not using the bad blocks.

BRIEF DESCRIPTION OF THE DRAWINGS

FIGS. 3A and 3B are a simplified diagrams illustrating a method of bad block management according to some embodiments of the invention;

DETAILED DESCRIPTION OF THE INVENTION

Figure 1:
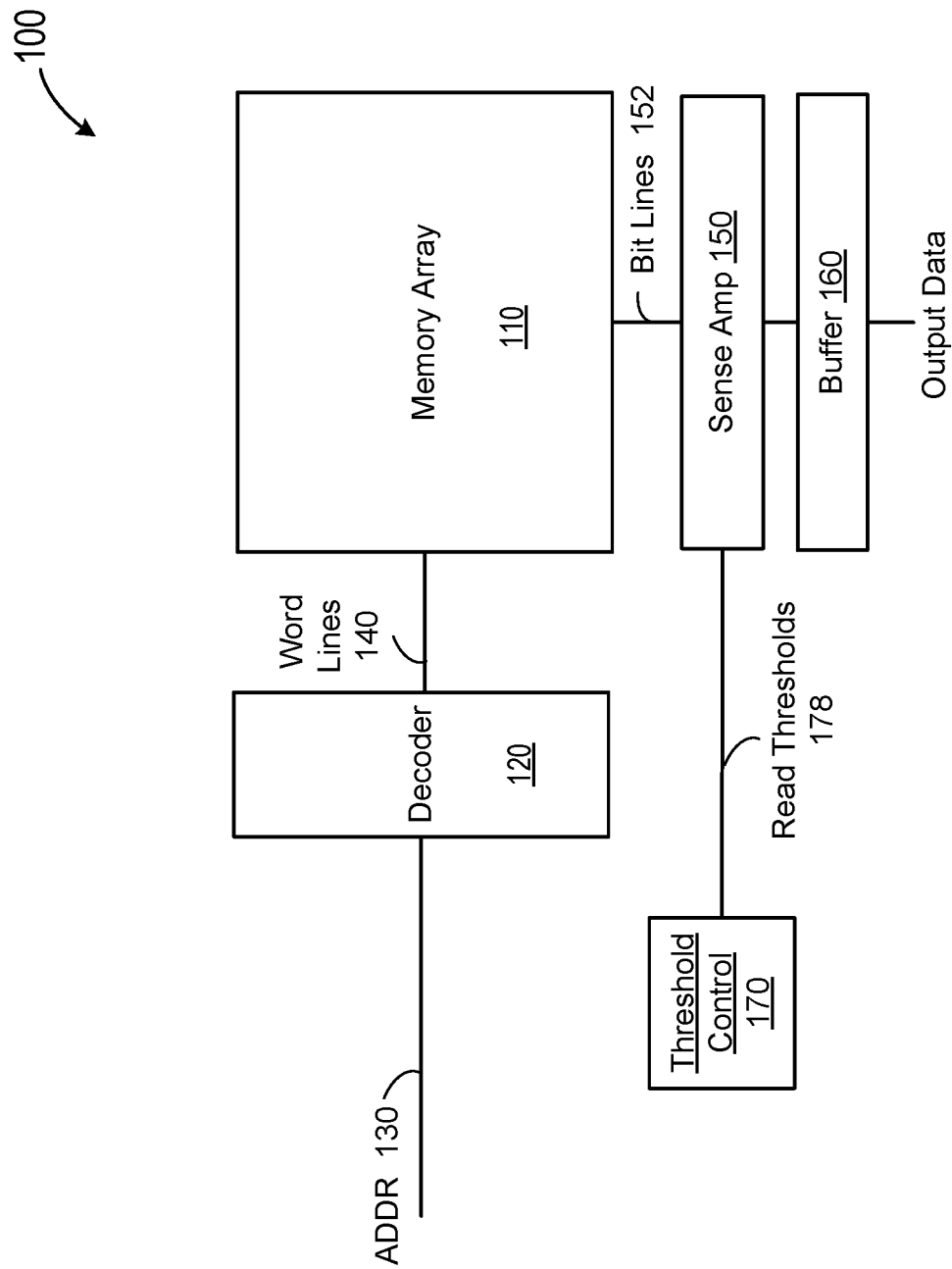
FIG. 1 is a simplified block diagram of a memory device according to some embodiments of the present invention.

FIG. 1 is a simplified block diagram of a memory device according to some embodiments of the present invention. In this example, a flash memory device 100 includes a memory cell array 110 having a plurality of non-volatile memory cells. In some embodiments, the memory cells are arranged in a plurality of memory blocks. Each memory block can include multiple non-volatile memory cells, each memory block being associated with a corresponding address. Memory device 100 also includes a decoder 120, for example a row decoder. In an example, decoder 120 receives a command for a memory operation with an address ADDR 130, e.g., a read command with a read address. The address 130 can be a logic address. In an embodiment, the memory operations, such as read, write or program, and erase, etc., are directed to a group of memory cells, for example, a page, a sector, or a block. As described above, a block can include multiple pages. A read or program command is often directed to a page, and an erase command can be directed to a block. Depending on the embodiment, a page or a sector can be 0.5 Kbytes to 4 Kbytes, or a different size. Depending on the embodiments, a page or a sector can include memory cells coupled to the same word line. In this case, decoder 120 selects word lines (WL) 140 based on information on ADDR 130 for selecting a memory page, which can be a row of memory cells coupled to the selected word line. Therefore, pages and word lines are used interchangeably.

A sense amplifier block 150 is coupled to memory cell array 110 through bit lines 152. A buffer block 160 is coupled to sense amplifier block 150 and provides output data to an external device. In a read operation, sense amplifier block 150 senses the data stored in each memory cell of the memory cell array 110 and provides the data to buffer block 160. In a write or program operation, buffer block 160 presents the data to be written or programmed to the memory array 110.

During a memory read operation, the charges in a non-volatile memory cell selected by a word line are read out. Depending on the charges stored in a memory cell, its cell threshold voltage can vary. A read voltage higher than cell threshold voltage can be used to determine the data stored in the memory cell. In some embodiments, each of the non-volatile memory cells can be a multilevel memory cell, and multiple threshold voltages are used to determine the data state of the memory cell, as represented by a bit pattern. In these cases, a threshold control circuit 170, which provides read thresholds 178, can be used to control the threshold voltages.

Flash-memory based solid state disk (SSD) drive can contain many flash memory dies. Each flash die can contain thousands of physical blocks. Each block can contain hundreds or thousands of flash pages. In some cases, a flash block is the atomic unit (i.e., the smallest addressable unit) for erase operation, and a flash page can be the atomic unit for read or program operation. In other words, in these cases, an erase operation is carried out one block at a time, and a read or program operation is carried out one page at a time.

During the lifetime of SSD, the reliability quality of flash blocks may be degraded overtime, and some blocks may be identified as bad blocks and removed from the available flash block list. Removing bad blocks can reduce the actual overprovisioning of the whole SSD and thus cause larger write amplification.

In a data storage device such as a solid state drive (SSD), overprovisioning refers to the inclusion of extra storage capacity. SSD overprovisioning can increase the endurance of a solid state drive by distributing the total number of writes and erases across a larger population of NAND flash blocks and pages over time. It can also improve performance by giving the flash controller additional buffer space for managing program/erase (P/E) cycles and improving the probability that a write operation will have immediate access to a pre-erased block. The extra capacity is not visible to the host as available storage.

Because flash memory must be erased before it can be rewritten, with much coarser granularity of the erase operation when compared to the write operation,[a] the process to perform these operations results in moving (or rewriting) user data and metadata more than once. Thus, rewriting some data requires an already used portion of flash to be read, updated, and written to a new location, together with initially erasing the new location if it was previously used at some point in time; due to the way flash works, much larger portions of flash must be erased and rewritten than actually required by the amount of new data. This multiplying effect, known as write amplification (WA), can increase the number of writes required over the life of the SSD, which shortens the time it can reliably operate. The increased writes also consume bandwidth to the flash memory which mainly reduces random write performance to the SSD. Write amplification can be measured by the ratio of writes committed to the flash memory to the writes coming from the host system.

Figure 2:
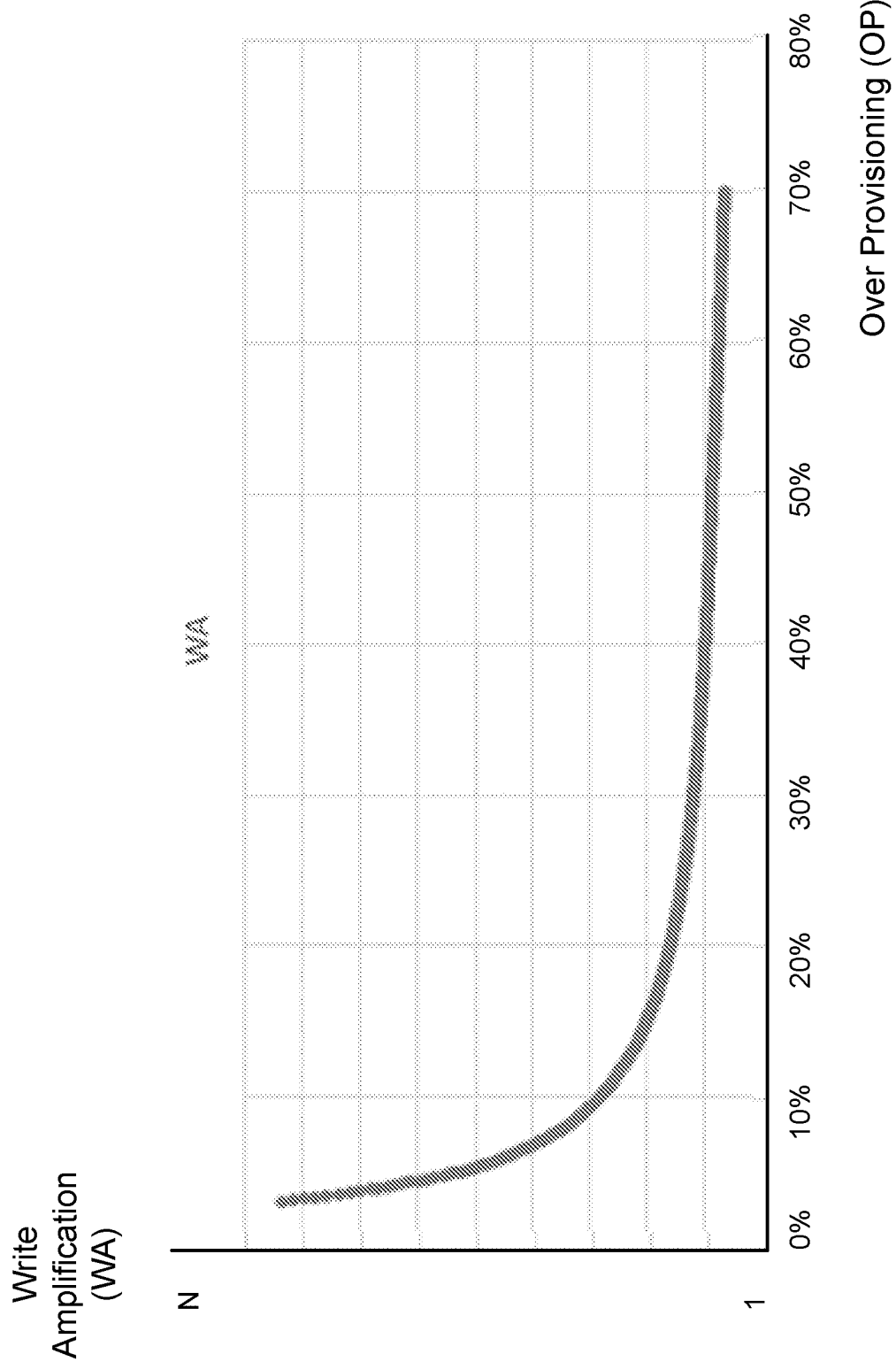
FIG. 2 is a simplified diagram illustrating correlation between write amplification and overprovisioning in a memory device according to some embodiments of the present invention.

FIG. 2 is a simplified diagram illustrating correlation between write amplification and overprovisioning in a memory device according to some embodiments of the present invention. The x-axis is overprovisioning (OP) and the y-axis is the write amplification (WA). In FIG. 2, the horizontal axis is the overprovisioning in percentage. The vertical axis is write amplification, which is often expressed in write amplification factor (WAF) and can be a number between 1 and N. It can be seen from FIG. 2 that as overprovisioning increases, write amplification decreases. In general, the more bad blocks, the smaller the overprovisioning, which tends to lead to more write amplification. The increasing write amplification can cause the flash blocks to be worn out faster and can cause the whole drive to come to the end of life quickly. In some conventional systems, whenever a bad word line or page is found anywhere in a block, the block is marked as bad block and removed from usage. This practice can exacerbate the problem of reducing over provisioning and increasing write amplification.

Figure 3A:
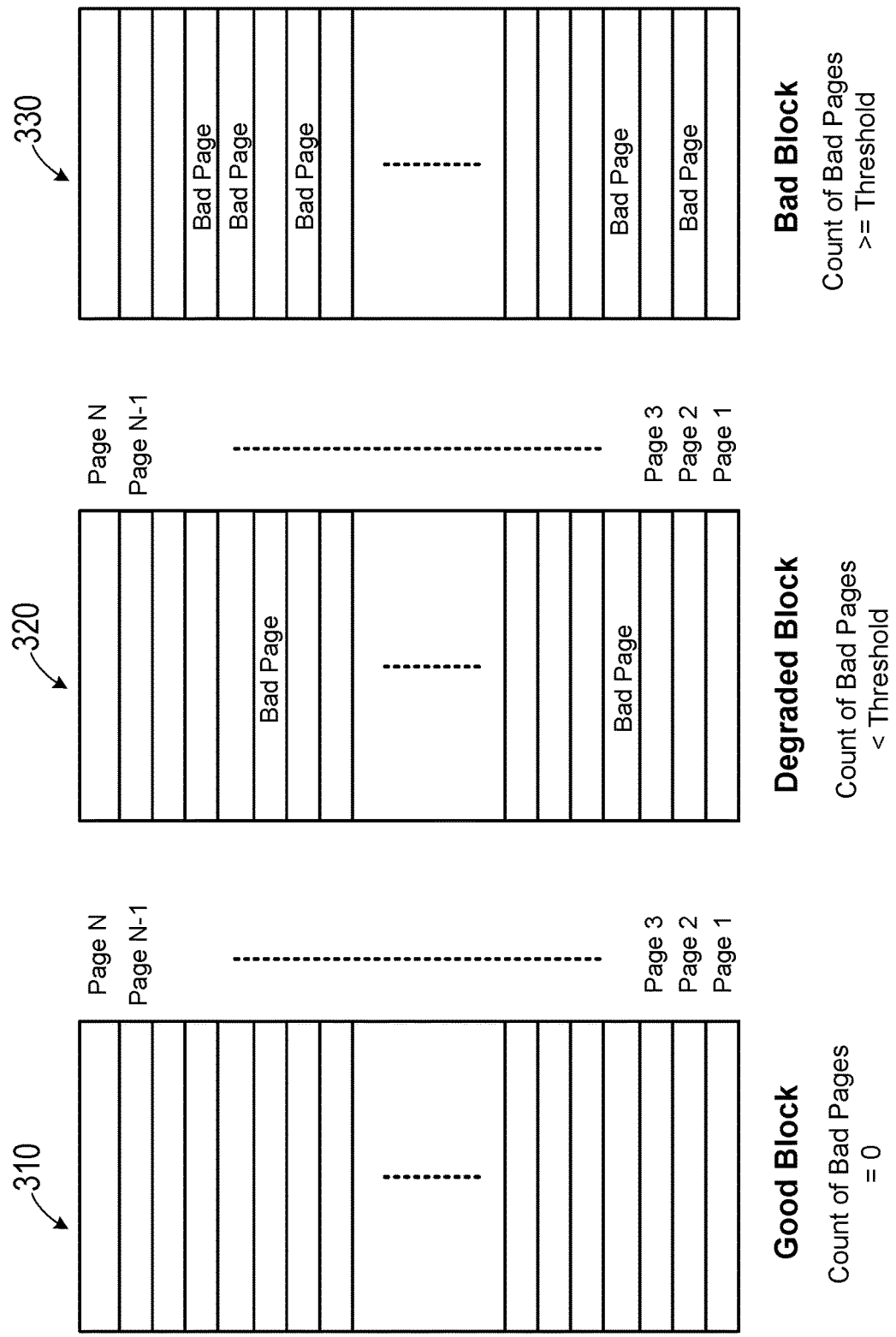

FIGS. 3A and 3B are a simplified diagrams illustrating a method of bad block management according to some embodiments of the invention. In some embodiments, all the blocks inside the SSD are classified in three types or categories: good block, degraded block, and bad block. FIG. 3A shows three blocks of memory cells, including a good block 310, a degraded block 320, and a bad block 330. Each block has N pages, numbered from 1, 2, . . . to N. A number of bad pages are also shown in FIG. 3A. Good blocks, such as block 310, are blocks that have no bad pages (or, identified by corresponding bad word lines). The bad blocks, such as 330, are blocks that have a high number of bad pages (e.g., over a threshold number) and are marked as unusable and removed from service. The degraded block, such as block 320, are blocks that have a certain number of bad pages (or bad word lines), but the number of bad pages is less than a certain threshold. Degraded blocks are retained for memory operations.

In some embodiments, the memory device can maintain a table that keeps track of the blocks. In some embodiments, the device can maintain tables for the three types of blocks. The controller in the memory device can be implemented in hardware, software, firmware, or combinations thereof. In some embodiments, the tables can be implemented as hash tables. As known in the art, a hash table is a data structure which implements an associative array, a structure that can map keys to values. A hash table uses a hash function to compute an index into an array of buckets or slots, from which the desired value can be found. Each table entry can include a block number, the number of bad pages, in the block, and a list of bad page locations.

FIG. 3B illustrates an exemplary table for degraded blocks that lists the block number of bad blocks (e.g., B1, B2, B3, . . . ), the number of bad pages in each block (e.g., N1, N2, N3, . . . ) and the location of bad pages in each block (e.g., L1, L2, L3 . . . ). The location of bad pages can be the page number of the bad page in the block. For example, a table entry of {1, 11, 1332, etc.} indicates that block #1 is a degraded block, which has 11 bad pages, and page #1332 is one of the bad pages.

Figure 4:
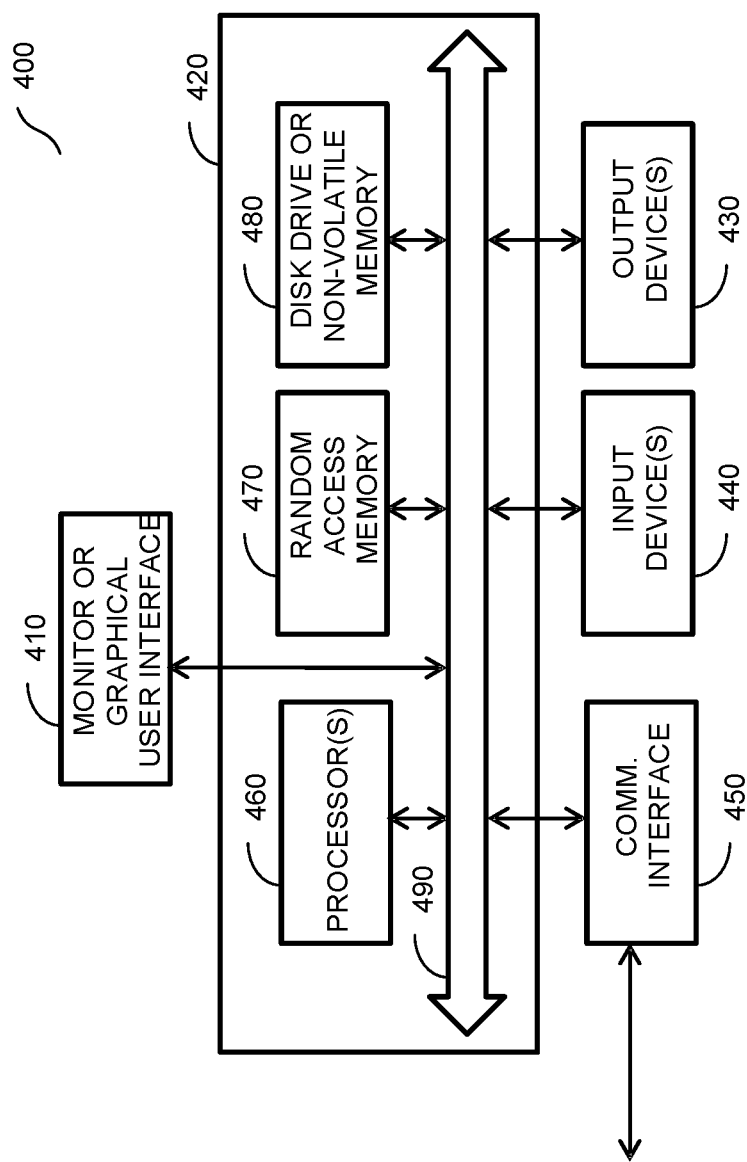
FIG. 4 is a simplified flowchart illustrating a method for degraded block management according to some embodiments of the invention.

FIG. 4 is a simplified flowchart illustrating a method for degraded block management according to some embodiments of the invention. In a solid state disk (SSD) device, a page is a logical unit that often refers to memory cells associated with a word line. Therefore, the terms "pages" and "word lines" are used interchangeable. When a read failure is detected in a block, the data in the page, which is coupled to a corresponding word line is recovered by an error recovery flow, such as soft-LDPC decoding, RAID recovery, etc. Once the data is recovered, the data in the bad word lines are copied to a good open block, and the total number of bad word lines of the block is increased by one. If the count of total bad word lines is larger than a certain threshold, the block is classified as a bad block. Otherwise, the block is added in the degraded block tables, and information regarding the corresponding new bad word lines is recorded. In some cases, the number of bad pages in the degraded block table is increased, and the location of the new bad page is stored in the table.

As shown in FIG. 4, a method 400 describes a process for handling degraded blocks in a system. The system includes a table of degraded blocks that, for each degraded block, lists a count of bad pages in the degraded block and locations of bad pages in the degraded block. The method includes, at 410, receiving information regarding a bad page, and at 420, determining if the bad page is in a good block or degraded block. At 430, upon determining that the bad page is in a good block, the good block is identified as a degraded block, and an entry is created in the table of degraded blocks. The table entry can include the block number, the location or corresponding word line number for the bad page, and the count of bad pages or word lines, which in this case is "1" for this new degraded block. At 440, upon determining that the bad page is in a degraded block, the degraded block is located in the table of degraded blocks, the count of bad pages in the degraded block is incremented, and the location of the bad page is recorded. At 450, the count of bad pages is compared with a threshold number to determine if the count of bad pages is greater than the threshold number. If the count of bad pages is greater than the threshold number, then, at 460, the block is determined to be a bad block, and the current block is added to a bad block table. At 470, if the count of bad pages is less than the threshold number, then the block remains a degraded block, and the table of degraded blocks is updated to include the new bad page count and location of the bad page in the degraded block.

Figure 5:
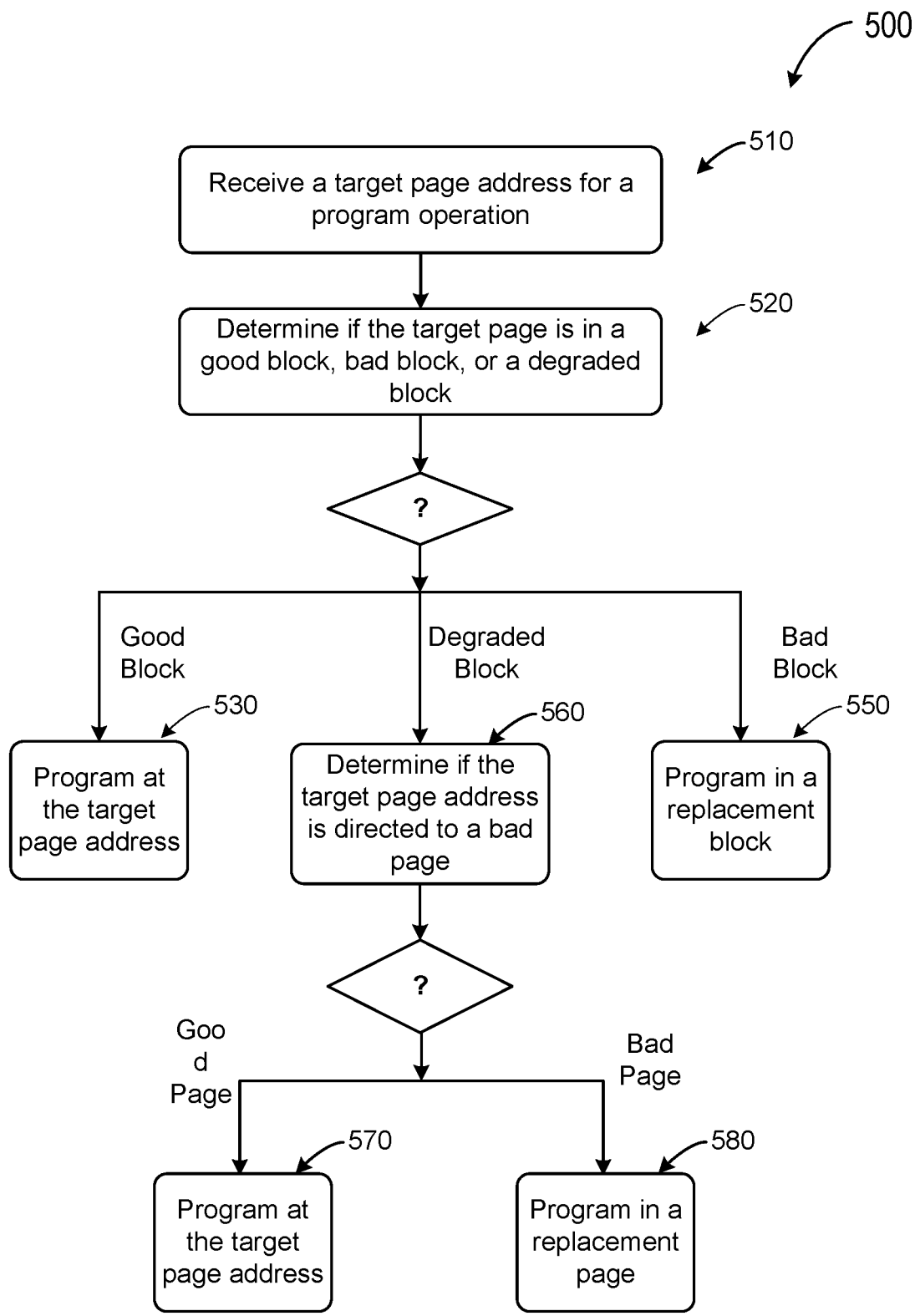
FIG. 5 is a simplified flowchart illustrating a process for programming in a degraded block according to embodiments of the present invention.

FIG. 5 is a simplified flowchart illustrating a process for programming in a degraded block according to embodiments of the present invention. During a program operation, the system first checks the condition of the target block. The bad blocks are not chosen as target blocks. If the target block is a good block, the data is programmed into the target block. If the target block is degraded block, the system checks the entry for the target page in the table for degraded blocks. If the target page is bad page, the system can program the data to a good page. The system can program random data to the bad page and its direct neighboring pages first, or skip the bad page and its direct neighboring pages.

The flowchart in FIG. 5 summarizes a method 500 for programming in a degraded block. At 510, the system receives a target page address for a program operation. At 520, the system determines if the target page address is in a good block, bad block, or a degraded block. At 530, upon determining that the target page address is in a good block, the system performs the program operation at the target page address. At 540, upon determining that the target page address is in a bad block, the system performs the program operation in a replacement block. At 550, upon determining that the target page address is in a bad block, the system performs the program at a replacement block. At 560, it is determined if the target page address is directed to a bad page. At 570, upon determining that the target page address is not directed to a bad page, the system performs the program operation at the target page address, and at 580, upon determining that the target page address is directed to a bad page, the system performs the program operation at a replacement page address.

Figure 6:
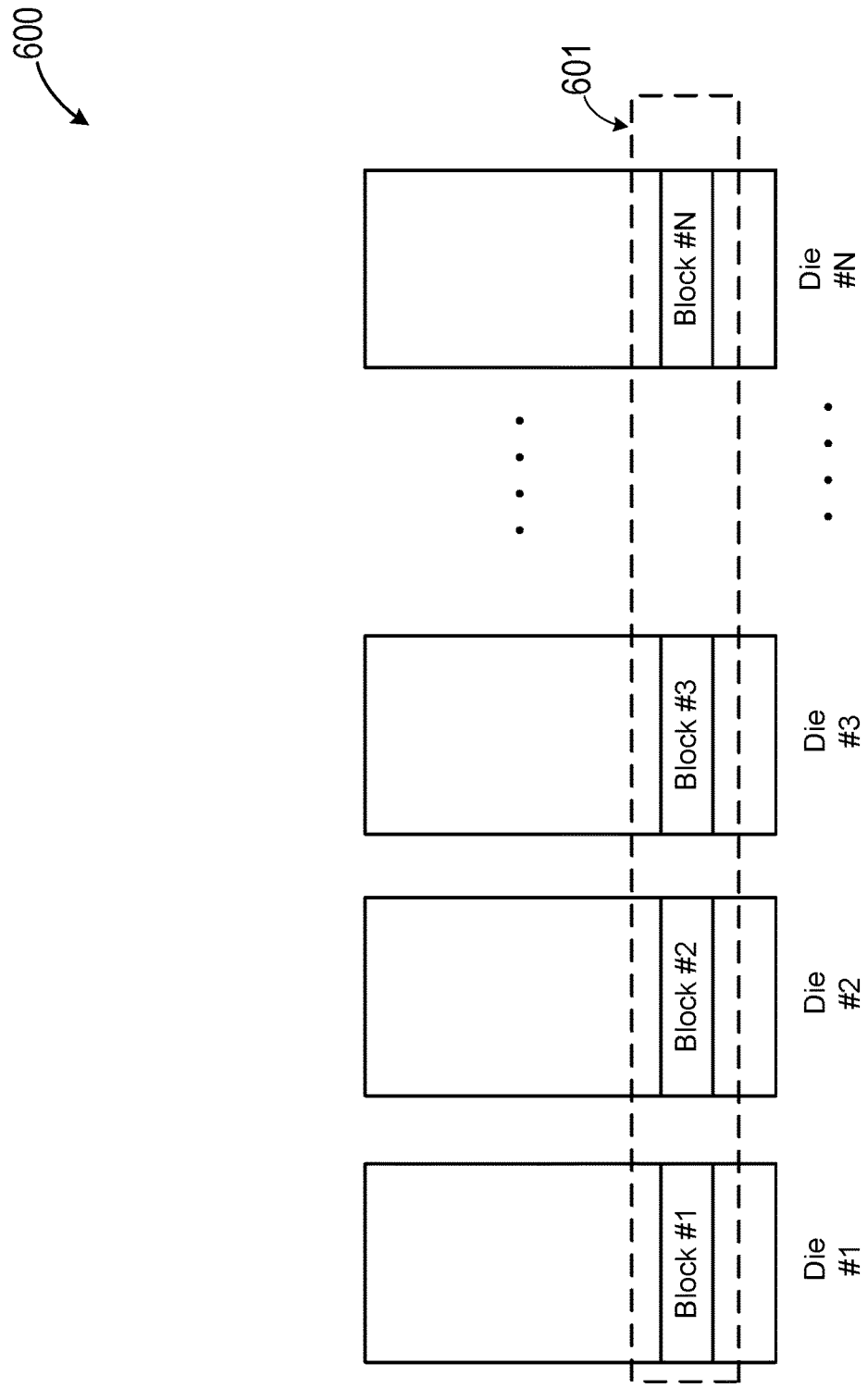
FIG. 6 is a simplified diagram illustrating a method for operating a super block according to some embodiments of the invention.

FIG. 6 is a simplified diagram illustrating a method for operating a super block according to some embodiments of the invention. As shown in FIG. 6, a non-volatile data storage device 600 includes multiple memory dies, labeled Die #1, Die #2, Die #3, . . . , Die #N. In this example, a super block 601 can include a block from each die, e.g., Block #1 from Die #1, Block #2 from Die #2, Block #3 from Die #3, . . . , Block #N from Die #N. In other embodiments, a super block can include multiple blocks, but the blocks in the super blocks are not restricted to blocks from different dies. A super block can be used as a logical unit in a memory operation. For example, in a super block, one of the blocks can be used as a parity block to store parity bits, and the remaining blocks can be used as data blocks to store data. As an example, the parity block can store parity bits obtained by an exclusive OR (XOR) operation of the corresponding data bits in the data blocks.

Figure 7:
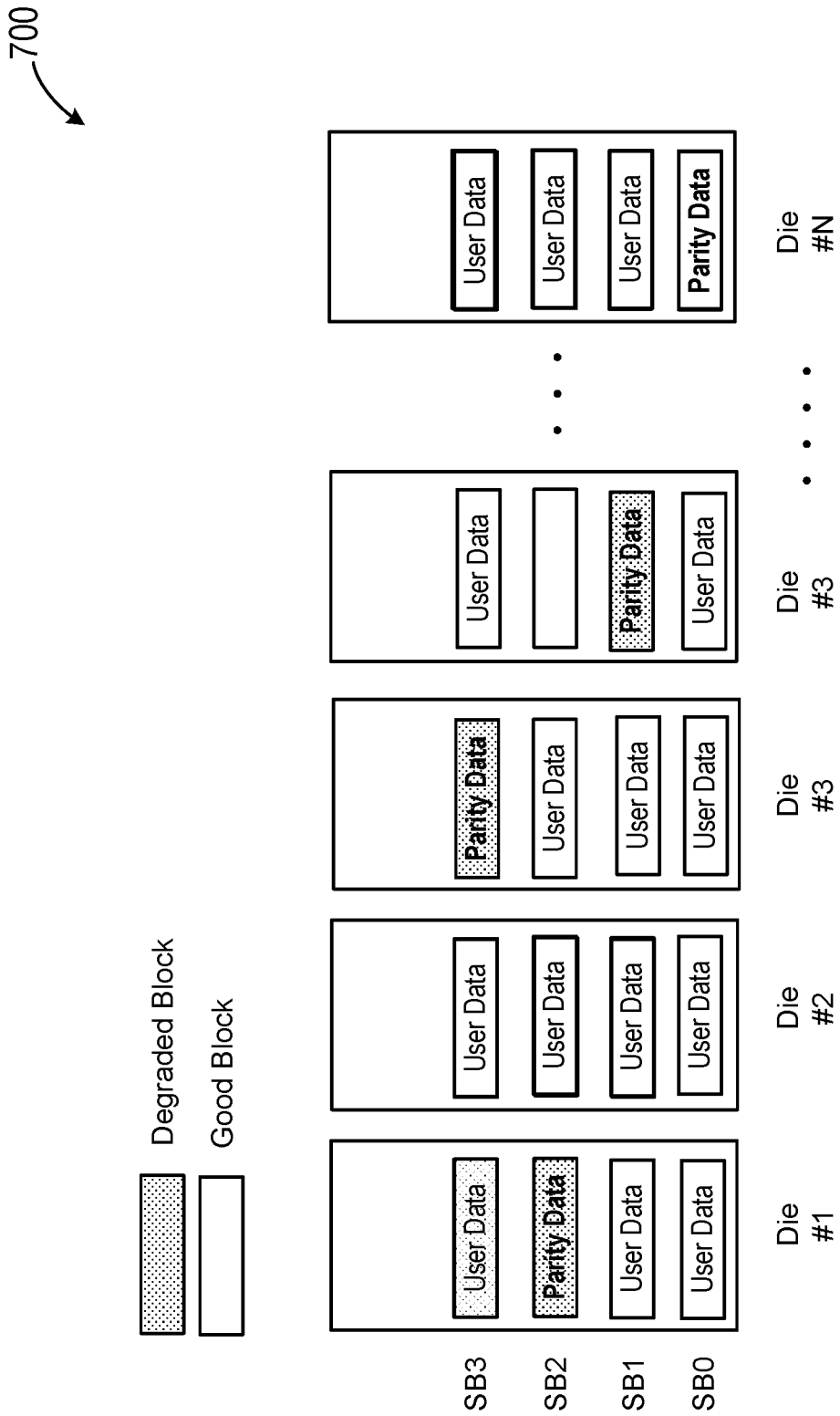
FIG. 7 is a simplified diagram illustrating a method for operating super blocks that include degraded blocks according to some embodiments of the invention.

FIG. 7 is a simplified diagram illustrating a method for operating super blocks that include degraded blocks according to some embodiments of the invention. If a strip of blocks that form a super block (SB) includes a degraded block, the degraded block can be chosen as the target block to store parity data, and the other good block can be used as data blocks and store normal data. In some embodiments, each superblock metadata can record the parity physical block number, and the parity physical block can be stored using a degraded physical block, if there are any degraded physical blocks in the super block.

An example of super blocks having degraded blocks is shown in FIG. 7. In this example, storage device 700 includes N memory dies, Die #1, Die #2, Die #3, Die #4, . . . , and Die #N. Four super blocks are shown, SB0, SB1, SB2, and SB3, each super block including a block from each die. Four degraded blocks are shown as shaded, and good blocks are shown as unshaded blocks. The degraded block can be prioritized to be a parity block. If there is no degraded physical block in a super block, the parity physical block can be selected from one of the good blocks. If there is only one degraded block, that degraded block can be picked as the parity block. If there are more than one degraded blocks, one of the degraded blocks can be selected as the parity block, and the remaining degraded blocks and other good blocks can be used as data blocks. This design does not affect program latency, as the normal user data can be programmed to the non-parity physical block in a strip first, and then the parity data of the programmed user data (e.g., from an XOR operation) can be programmed to the selected parity block. In the example of FIG. 7, a good block in SB0 (in Die #N) is used as the parity block, and a degraded block in each of SB1 (in Die #3), SB2 (in Die #1), and SB3 (in Die #3) is used as the parity block. SB4 has two degraded blocks (in Die #1 and Die #3); one of the degraded blocks, in Die #3, is used as the parity block, and the other degraded block, in Die #1, is used as a data block for storing user data. The parity block is usually not read unless errors occur in other blocks. Therefore, the lower reliability of the degraded block is not as risky if used as a parity block. This design can improve the read latency as there are lower numbers of read retries on the normal data.

The above schemes can be applied to enhance existing super block operations. In a non-volatile data storage device that includes super blocks, and each super block includes a plurality of blocks. The storage device can rank the plurality of blocks according to a reliability quality, and configure the block with the lowest reliability as a parity block and other blocks are configured as data blocks. The parity block is used to store parity information of the data blocks. As an example, in an SB without any degraded block, where all the blocks are good blocks, the reliability quality of the physical blocks can be ranked in a super block. In some embodiments, a physical block with less reliability, e.g., higher raw BER (bit error rate), can be recorded, and such a block can be chosen as a chipkill parity block. Then, the normal user data can be stored on relative high quality blocks. The read retry rate and chipkill triggering rate can be decreased, and the read latency can be shortened.

Figure 8:
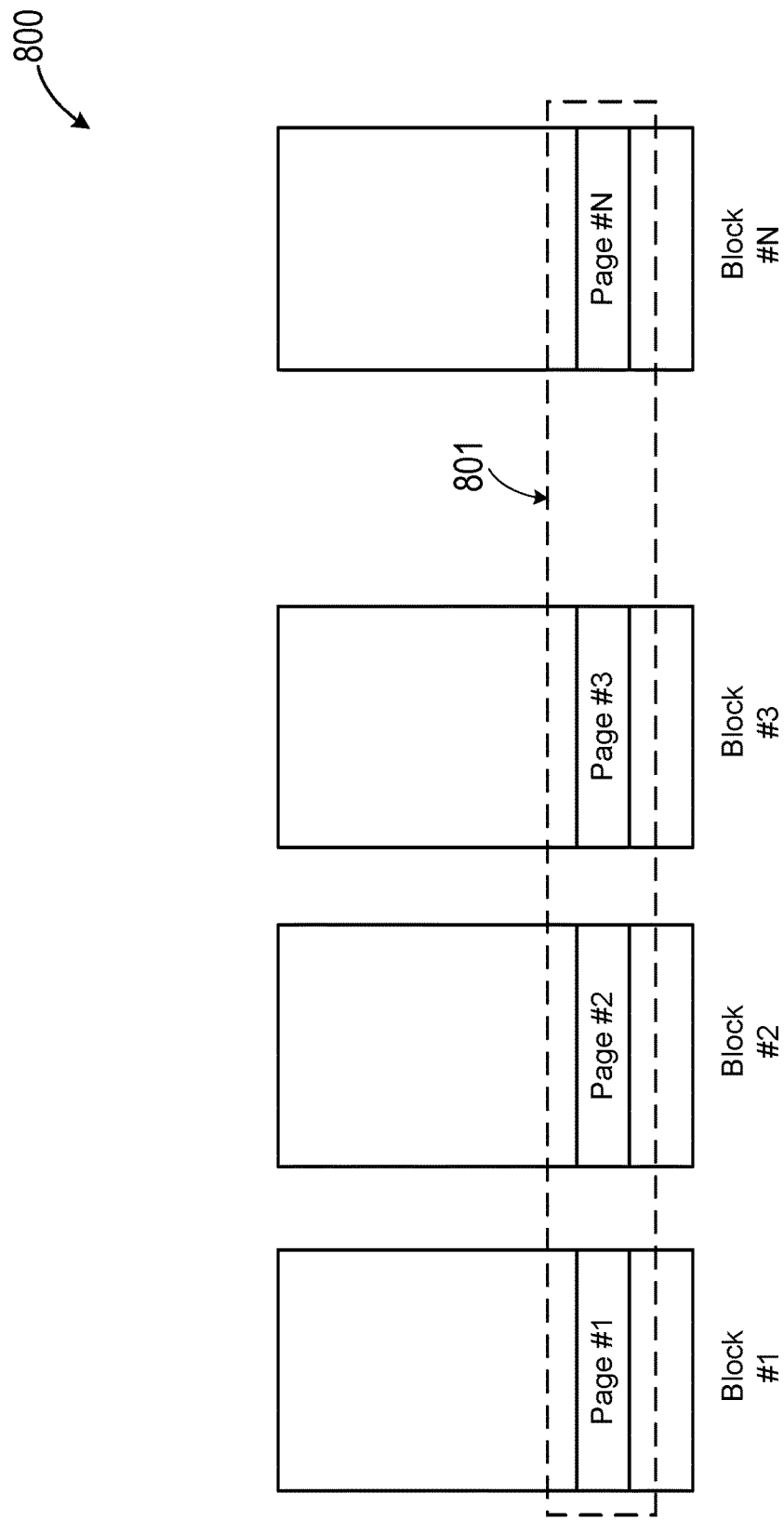
FIG. 8 illustrates a method for operating a non-volatile data storage device that includes a super page according to some embodiments of the present invention.

FIG. 8 illustrates a method for operating a non-volatile data storage device that includes a super page according to some embodiments of the present invention. A super page can have multiple pages configured as logic units for memory operations. In some cases, each page can be disposed in a different block. In some cases, the blocks can be disposed in different dies. However, there can be other physical arrangements. In some embodiments, one of the pages can be used as parity page for storing parity bits derived from data in the other pages in the super page, e.g., by a XOR operation. As shown in FIG. 8, a non-volatile data storage device 800 can include multiple memory blocks, labeled Block #1, Block #2, Block #3, . . . , Block #N. In this example, a super page 801 can include a block from each die, e.g., Page #1 from Block #1, Page #2 from Block #2, Page #3 from Block #3, . . . , Page #N from Block #N.

A degraded block can have one or more bad pages. If there is a bad page in a degraded block, then the bad page is not used, and one of the good pages in the super page is used as a parity block. In this case, the super page has one fewer data page than good super pages. As described above, the degraded block can be used as a parity block. Therefore, the risk of having one fewer data pages in a super page can be reduced as a parity page.

In some embodiments, the non-volatile data storage device can be configured to determine if a super page includes a bad page. Upon determining that the super page includes a bad page, the storage device excludes the bad page from operation and configures one of the remaining pages as a parity page and the other remaining pages as data pages.

Some embodiments of the invention provide an intermediate state between a physical block changing from a good block to a bad block when the number of bad word lines inside a block is less than a certain threshold. This can delay the block retirement, increase overprovisioning (OP), and reduce unnecessary background operations. Some embodiments also includes techniques to cluster the block types and program the degraded block.

Some embodiments also includes techniques for using degraded physical blocks as parity blocks to reduce the read retry rate on normal user data reading. It can decrease the read retry times and thus reduce the read latency.

Figure 9:
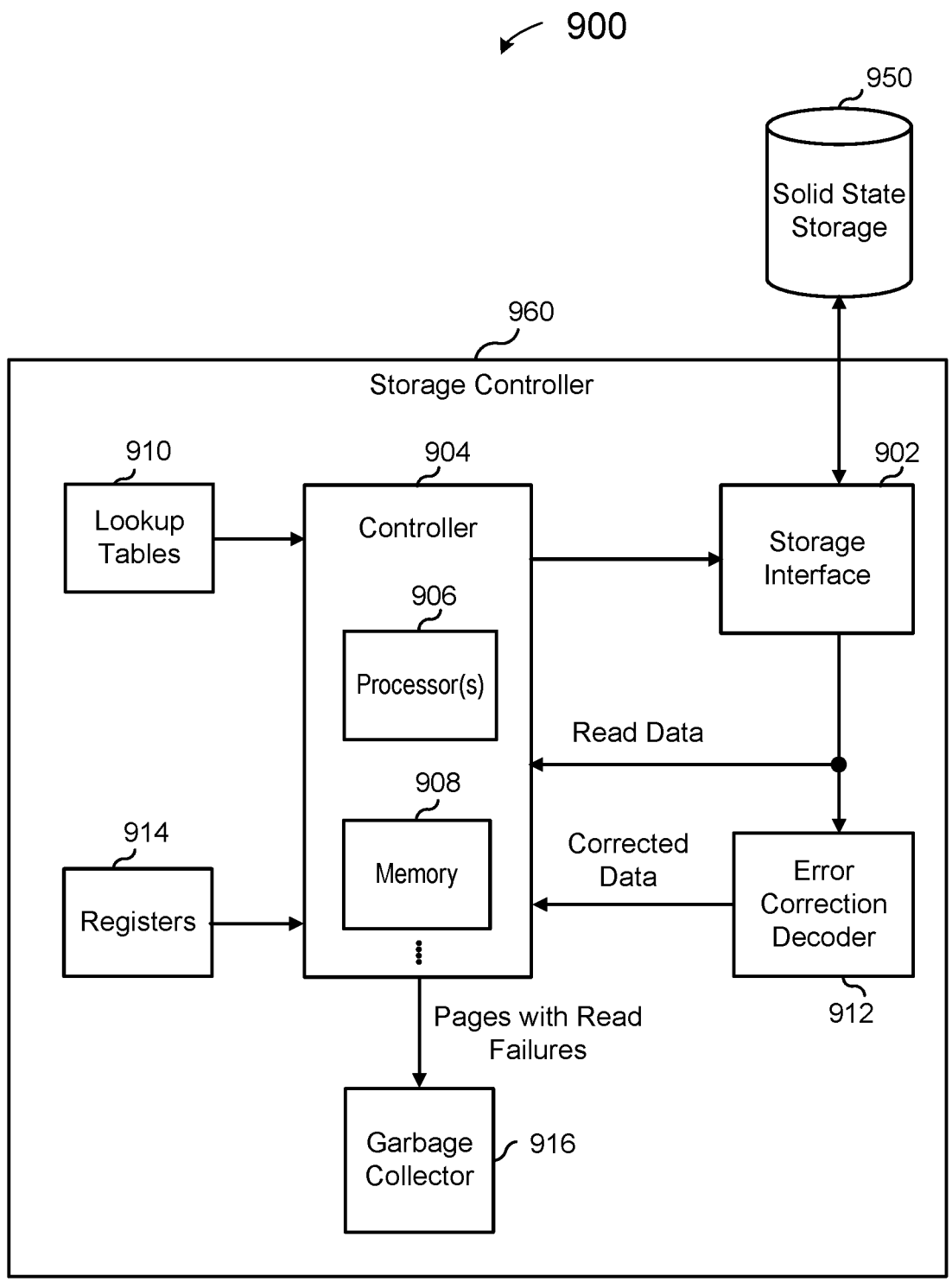
FIG. 9 is a simplified block diagram illustrating a solid state storage system according to some embodiments of the present invention.

FIG. 9 is a simplified block diagram illustrating a solid state storage system according to some embodiments of the present invention. As shown, solid state storage system 900 can include a solid state storage device 950 and a storage controller 960. For example, solid state storage device 950 can include a flash memory device 100 as depicted in FIG. 1. Storage controller 960, also referred to as a memory controller, is one example of a system which performs the techniques described herein. In some embodiments, storage controller 960 can be implemented on a semiconductor device, such as an ASIC or FPGA. Some of the functions can also be implemented in firmware.

Controller 904 can include one or more processors 906 and memories 908 for performing the control functions described above. Storage controller 960 can also include lookup tables 910, which can include a table for degraded blocks and a table for bad blocks, etc. Registers 914 can be used to store data for control functions, such as threshold values for degraded block counts, etc.

Controller 904 can be coupled to solid state storage 950 through a storage interface 902. Error correction decoder 912 (e.g., an LDPC decoder or a BCH decoder) can perform error correction decoding on the read data and sends the corrected data to controller 904. Controller 904 can identify the pages with read failures to garbage collector 916, which performs corrective processing on those pages (e.g., by copying the data, with or without error correction decoding, to a new location).

Figure 10:
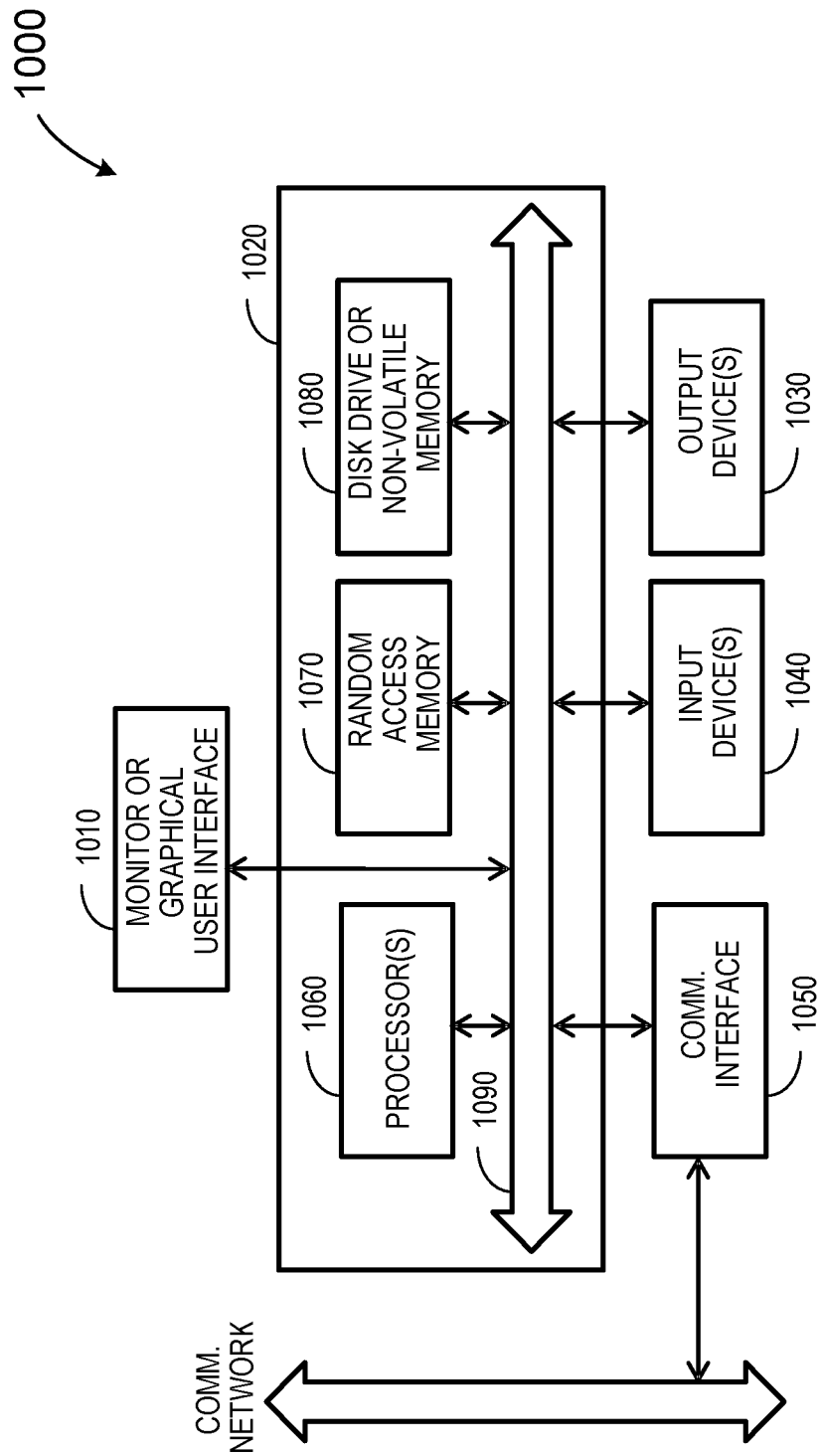
FIG. 10 is a simplified block diagram illustrating an apparatus that may be used to implement various embodiments according the present invention.

FIG. 10 describes one potential implementation of a system which may use embodiments of the present disclosure. FIG. 10 is merely illustrative of an embodiment incorporating the present disclosure and does not limit the scope of the invention as recited in the claims. One of ordinary skill in the art would recognize other variations, modifications, and alternatives. In one embodiment, computer system 1000 typically includes a monitor 1010, a computer 1020, user output devices 1030, user input devices 1040, communications interface 1050, and the like.

As shown in FIG. 10, computer 1020 may include a processor(s) 1060 that communicates with a number of peripheral devices via a bus subsystem 1090. These peripheral devices may include user output devices 1030, user input devices 1040, communications interface 1050, and a storage subsystem, such as random access memory (RAM) 1070 and disk drive 1080. As an example, a disk drive can include solid state disk (SSD) implemented with non-volatile memory devices such as memory device 100 depicted in FIG. 1 with features described above.

User input devices 1040 include all possible types of devices and mechanisms for inputting information to computer system 1020. These may include a keyboard, a keypad, a touch screen incorporated into the display, audio input devices such as voice recognition systems, microphones, and other types of input devices. In various embodiments, user input devices 1040 are typically embodied as a computer mouse, a trackball, a track pad, a joystick, wireless remote, drawing tablet, voice command system, eye tracking system, and the like. User input devices 1030 typically allow a user to select objects, icons, text and the like that appear on the monitor 1010 via a command such as a click of a button or the like.

User output devices 1030 include all possible types of devices and mechanisms for outputting information from computer 1020. These may include a display (e.g., monitor 1010), non-visual displays such as audio output devices, etc.

Communications interface 1050 provides an interface to other communication networks and devices. Communications interface 1050 may serve as an interface for receiving data from and transmitting data to other systems. Embodiments of communications interface 1050 typically include an Ethernet card, a modem (telephone, satellite, cable, ISDN), (asynchronous) digital subscriber line (DSL) unit, FireWire interface, USB interface, and the like. For example, communications interface 1050 may be coupled to a computer network, to a FireWire bus, or the like. In other embodiments, communications interfaces 1050 may be physically integrated on the motherboard of computer 1020, and may be a software program, such as soft DSL, or the like.

In various embodiments, computer system 1000 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1020 includes one or more Xeon microprocessors from Intel as processor(s) 1060. Further, one embodiment, computer 1020 includes a UNIX-based operating system.

RAM 1070 and disk drive 1080 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1070 and disk drive 1080 may be configured to store the basic programming and data constructs that provide the functionality of the present invention.

Software code modules and instructions that provide the functionality of the present invention may be stored in RAM 1070 and disk drive 1080. These software modules may be executed by processor(s) 1060. RAM 1070 and disk drive 1080 may also provide a repository for storing data used in accordance with the present invention.

RAM 1070 and disk drive 1080 may include a number of memories including a main random access memory (RAM) for storage of instructions and data during program execution and a read only memory (ROM) in which fixed non-transitory instructions are stored. RAM 1070 and disk drive 1080 may include a file storage subsystem providing persistent (non-volatile) storage for program and data files. RAM 1070 and disk drive 1080 may also include removable storage systems, such as removable flash memory.

Bus subsystem 1090 provides a mechanism for letting the various components and subsystems of computer 1020 communicate with each other as intended. Although bus subsystem 1090 is shown schematically as a single bus, alternative embodiments of the bus subsystem may utilize multiple busses. Bus system 1090 may be a PCI Express bus that may be implemented using PCIe PHY embodiments of the present disclosure.

FIG. 10 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A non-volatile data storage device, comprising:
    memory cells arranged in blocks, each block including multiple pages and each page having a number of memory cells;
    a memory controller coupled to the memory cells for controlling erase, program, and read operations of the memory cells;
    wherein each block is identified as a good block, degraded block, or bad block based on a count of bad pages in the block, and each block being identified:
        as a good block if the count of bad pages is zero;
        as a degraded block if the count of bad pages is below a threshold number; and
        as a bad block if the count of bad pages is above or equal to the threshold number;
    a table of degraded blocks that, for each degraded block, lists a count of bad pages in the degraded block and locations of bad pages in the degraded block;
    wherein the memory controller is configured to:
        receive information regarding a bad page;
        determine if the bad page is in a good block or degraded block;
        upon determining that the bad page is in a good block, identify the good block as a degraded block and create an entry in the table of degraded blocks;
        upon determining that the bad page is in a degraded block, locate the degraded block in the table of degraded blocks, increase the count of bad pages in the degraded block, and record the location of the bad page;
        determine if the count of bad pages is greater than the threshold number;
        upon determining that the count of bad pages is greater than the threshold number, determine that the block is a bad block;
    wherein the memory controller is configured to use good blocks and degraded blocks for read and program operations, and not use the bad blocks.

2. The non-volatile data storage device of claim 1, wherein, receiving information regarding a bad page comprises:
    performing a read operation at a target page address;
    determining if a read failure has occurred;
    upon detecting a read failure, identifying the page as a bad page;
    recovering correct data in the page at the target page address;
    copying the correct data to a good block.

3. The non-volatile data storage device of claim 1, wherein the memory controller is configured to:
    receive a target page address for a program operation;
    determine if the target page address is in a good block, bad block, or a degraded block;
    upon determining that the target page address is in a good block, perform the program operation at the target page address;
    upon determining that the target page address is in a bad block, perform the program operation in a replacement block;
    upon determining that the target page address is in a degraded block, determine if the target page address is directed to a bad page;
        upon determining that the target page address is not directed to a bad page, perform the program operation at the target page address; and
        upon determining that the target page address is directed to a bad page, perform the program operation at a replacement page address.

4. The non-volatile data storage device of claim 1, further comprising multiple super blocks, each super block including a plurality of blocks, wherein one of the plurality of blocks is configured as a parity block and other blocks are configured as data blocks, the parity block being configured to store parity information of the data blocks;

wherein the memory controller is configured to:
determine if a super block includes a degraded block; and
upon determining that the super block includes a degraded block, configure the degraded block as the parity block for the super block.

5. The non-volatile data storage device of claim 4, further comprising multiple super pages, each super page including a plurality of pages, with one page from each block in the super block, wherein one of the plurality of pages in a super page is configured as a parity page and other pages are configured as data pages, the parity page being configured to store parity information of the data pages;
wherein the memory controller is configured to:
determine if a super page includes a bad page; and
upon determining that the super page includes a bad page, exclude the bad page from operation and configure one of the remaining pages as a parity page and the other remaining pages as data pages.

6. The non-volatile data storage device of claim 1, further comprising multiple super blocks, each super block including a plurality of blocks, wherein the memory controller is configured to:
rank the plurality of blocks according to a reliability quality; and
configure the block with the lowest reliability as a parity block and other blocks are configured as data blocks, the parity block being configured to store parity information of the data blocks.

7. The non-volatile data storage device of claim 1, wherein each block comprises a plurality of memory cells coupled to a same word line.

8. A system, comprising:
memory cells arranged in blocks, each block including multiple pages and each page having a number of memory cells;
a memory controller coupled to the memory cells for controlling erase, program, and read operations of the memory cells;
wherein the memory controller is configured to:
identify a block as a good block, if a count of bad pages in the block is zero;
identify a block as a degraded block if the count of bad pages is below a threshold number; and
identify a block as a bad block if the count of bad pages is above or equal to the threshold number;
wherein the memory controller is configured to use good blocks and degraded blocks for read and program operations, and not use the bad blocks;
wherein the memory controller is configured to:
receive a target page address for a program operation;
determine if the target page address is in a good block, bad block, or a degraded block;
upon determining that the target page address is in a good block, perform the program operation at the target page address;
upon determining that the target page address is in a bad block, perform the program operation in a replacement block;
upon determining that the target page address is in a degrade block,
determine if the target page address is directed to a bad page;
upon determining that the target page address is not directed to a bad page, perform the program operation at the target page address; and
upon determining that the target page address is directed to a bad page, perform the program operation at a replacement page address.

9. The system of claim 8, wherein the system further comprises a table of degraded blocks that, for each degraded block, lists a count of bad pages in the degraded block and locations of bad pages in the degraded block;
wherein the memory controller is configured to:
receive information regarding a bad page;
determine if the bad page is in a good block or degraded block;
upon determining that the bad page is in a good block, identify the good block as a degraded block and create an entry in the table of degraded blocks;
upon determining that the bad page is in a degraded block, locate the degraded block in the table of degraded blocks, increase the count of bad pages in the degraded block, and record the location of the bad page;
determine if the count of bad pages is greater than the threshold number;
upon determining that the count of bad pages is greater than the threshold number, determine that the block is a bad block.

10. The system of claim 8, further comprising multiple super blocks, each super block including a plurality of blocks, wherein one of the plurality of blocks is configured as a parity block and other blocks are configured as data blocks, the parity block being configured to store parity information of the data blocks;
wherein the memory controller is configured to:
determine if a super block includes a degraded block; and
upon determining that the super block includes a degraded block, configure the degraded block as the parity block for the super block.

11. The system of claim 10, further comprising multiple super pages, each super page including a plurality of pages, with one page from each block in the super block, wherein one of the plurality of pages in a super page is configured as a parity page and other pages are configured as data pages, the parity page being configured to store parity information of the data pages;
wherein the memory controller is configured to:
determine if a super page includes a bad page; and
upon determining that the super page includes a bad page, exclude the bad page from operation and configure one of the remaining pages as a parity page and the other remaining pages as data pages.

12. The system of claim 8, further comprising multiple super blocks, each super block including a plurality of blocks, wherein the memory controller is configured to:
rank the plurality of blocks according to a reliability quality; and
configure the block with the lowest reliability as a parity block and other blocks are configured as data blocks, the parity block being configured to store parity information of the data blocks.

13. A method of controlling a storage system, the storage system including a plurality of memory cells arranged in blocks and a memory controller coupled to the plurality of memory cells for controlling data write and read in the plurality of memory cells, the method comprising:
identifying a block as a good block, if a count of bad pages in the block is zero;
identifying the block as a degraded block if the count of bad pages is below a threshold number;

identifying the block as a bad block if the count of bad pages is above or equal to the threshold number; and using good blocks and degraded blocks for read and program operations, and not using the bad blocks;

wherein the storage system further comprises multiple super blocks, each super block including a plurality of blocks, wherein one of the plurality of blocks is configured as a parity block and other blocks are configured as data blocks, the parity block being configured to store parity information of the data blocks, the method further comprising:

determining if a super block includes a degraded block; and upon determining that the super block includes a degraded block, configuring the degraded block as the parity block for the super block.

14. The method of claim 13, wherein the system further comprises a table of degraded blocks that, for each degraded block, lists a count of bad pages in the degraded block and locations of bad pages in the degraded block, the method comprising:

receiving information regarding a bad page;

determining if the bad page is in a good block or degraded block;

upon determining that the bad page is in a good block, identifying the good block as a degraded block and create an entry in the table of degraded blocks;

upon determining that the bad page is in a degraded block, locating the degraded block in the table of degraded blocks, increasing the count of bad pages in the degraded block, and recording the location of the bad page;

determining if the count of bad pages is greater than the threshold number;

upon determining that the count of bad pages is greater than the threshold number, determining that the block is a bad block.

15. The method of claim 13, further comprising:

receiving a target page address for a program operation;

determining if the target page address is in a good block, bad block, or a degraded block;

upon determining that the target page address is in a good block, performing the program operation at the target page address;

upon determining that the target page address is in a bad block, performing the program operation in a replacement block;

upon determining that the target page address is in a degrade block, determining if the target page address is directed to a bad page;

upon determining that the target page address is not directed to a bad page, performing the program operation at the target page address; and upon determining that the target page address is directed to a bad page, performing the program operation at a replacement page address.

16. The method of claim 13 wherein further comprising multiple super pages, each super page including a plurality of pages, with one page from each block in the super block, wherein one of the plurality of pages in a super page is configured as a parity page and other pages are configured as data pages, the parity page being configured to store parity information of the data pages, the method further comprising:

determining if a super page includes a bad page; and upon determining that the super page includes a bad page, excluding the bad page from operation and configuring one of the remaining pages as a parity page and the other remaining pages as data pages.

17. The method of claim 13, further comprising:

ranking the plurality of blocks according to a reliability quality; and configuring the block with the lowest reliability as a parity block and other blocks are configured as data blocks, the parity block being configured to store parity information of the data blocks.

18. The method of claim 13, wherein each block comprises a plurality of memory cells coupled to a same word line.

* * * * *